United States Patent
Jaakkola

(10) Patent No.: US 11,736,087 B2
(45) Date of Patent: Aug. 22, 2023

(54) COUPLED MEMS RESONATOR

(71) Applicant: KYOCERA Tikitin Oy, Espoo (FI)

(72) Inventor: Antti Jaakkola, Espoo (FI)

(73) Assignee: KYOCERA Tikitin Oy, Espoo (FI)

(*) Notice: Subject to any disclaimer, the term of this patent is extended or adjusted under 35 U.S.C. 154(b) by 0 days.

(21) Appl. No.: 17/521,180

(22) Filed: Nov. 8, 2021

(65) Prior Publication Data
US 2022/0060171 A1 Feb. 24, 2022

Related U.S. Application Data

(63) Continuation of application No. 16/607,165, filed as application No. PCT/FI2019/050086 on Feb. 6, 2019, now Pat. No. 11,196,402.

(30) Foreign Application Priority Data

Feb. 8, 2018 (FI) .................................. 20185112

(51) Int. Cl.
*H03H 9/02* (2006.01)
*B81B 3/00* (2006.01)
(Continued)

(52) U.S. Cl.
CPC ....... *H03H 9/02244* (2013.01); *B81B 3/0018* (2013.01); *B81B 7/04* (2013.01);
(Continued)

(58) Field of Classification Search
CPC ............ H03H 9/02244; H03H 9/0595; H03H 9/2447; H01L 41/0933
See application file for complete search history.

(56) References Cited

U.S. PATENT DOCUMENTS 7,750,759 B1 7/2010 Lee et al.
8,450,913 B1 * 5/2013 Ayazi .................. H03H 9/2463
310/366
(Continued)

FOREIGN PATENT DOCUMENTS

EP 1900095 B1 9/2009
EP 2515436 A1 10/2012
(Continued)

OTHER PUBLICATIONS

Serrano et al, "Tunable Piezoelectric MEMS Resonators for Real-Time Clock", May 2011, DOI:10.1109/FCS2011.5977885, 5 pages.
(Continued)

*Primary Examiner* — Bryan P Gordon
(74) *Attorney, Agent, or Firm* — Ziegler IP Law Group, LLC

(57) ABSTRACT

A microelectromechanical resonator assembly includes a first rectangular resonator array and a second rectangular resonator array, where the first rectangular resonator array and the second rectangular resonator array each have at least two rectangular resonator sub-elements, and the at least two rectangular resonator sub-elements are coupled to each other by one or more connection elements, and the first rectangular resonator array and the second rectangular resonator array are coupled to each other by one or more connection elements.

20 Claims, 12 Drawing Sheets

(51) Int. Cl.
*B81B 7/04* (2006.01)
*H03H 9/05* (2006.01)
*H03H 9/24* (2006.01)
*H10N 30/20* (2023.01)

(52) U.S. Cl.
CPC ........ *H03H 9/0595* (2013.01); *H03H 9/2447* (2013.01); *H10N 30/2041* (2023.02); *H03H 2009/02496* (2013.01)

(56) References Cited

U.S. PATENT DOCUMENTS

| | | | |
|---|---|---|---|
| 9,559,660 B2* | 1/2017 | Pensala | H03H 3/0076 |
| 2004/0256371 A1 | 12/2004 | Stewart | |
| 2007/0001783 A1* | 1/2007 | Lutz | H03H 9/2431 |
| | | | 333/186 |
| 2008/0150392 A1 | 6/2008 | Delevoye et al. | |
| 2010/0327992 A1* | 12/2010 | Suzuki | H03H 9/2463 |
| | | | 333/186 |
| 2011/0121682 A1 | 5/2011 | Mohanty et al. | |
| 2012/0038431 A1 | 2/2012 | Jaakkola et al. | |
| 2013/0214879 A1 | 8/2013 | Gorisse et al. | |
| 2017/0033767 A1* | 2/2017 | Kawashima | H03H 9/1021 |
| 2017/0119351 A1* | 5/2017 | Yamasaki | A61B 8/4427 |

FOREIGN PATENT DOCUMENTS

| | | |
|---|---|---|
| JP | 2008103777 A | 5/2008 |
| JP | 2008545333 A | 12/2008 |
| WO | 2007005132 A1 | 1/2007 |
| WO | 2012110708 A1 | 8/2012 |
| WO | 2016/064678 A1 | 4/2016 |
| WO | 2017/066195 A1 | 4/2017 |
| WO | 2018/002439 A1 | 1/2018 |

OTHER PUBLICATIONS

European Patent Office, Extended European Search Report, Application No. 19751702.2, dated Oct. 8, 2021, 10 pages.

European Patent Office, Extended European Search Report, Application No. 19751882.2, dated Oct. 8, 2021, 10 pages.

Notice of Acceptance received for Finnish Patent Application No. FI20185112, dated Jun. 14, 2019, 04 pages.

Search report received for Finnish Patent Application No. FI20185112, dated Oct. 5, 2018, 02 pages.

International Search report and Written Opinion received for International Patent Application No. PCT/FI2019/050086, dated Apr. 15, 2019, 10 pages.

Jaakkola, Antti, et al., "Experimental Study of the Effects of Size Variations on Piezoelectrically Transduced MEMS Resonators", IEEE International Frequency Control Symposium, Jun. 1-4, 2010, pp. 410-414.

Bourgeteau-Verlhac, Beatrice, et al., "Gold Thin Film Viscoelastic Losses of a Length Extension Mode Resonator", European Frequency and Time Forum (EFTF), Apr. 4-7, 2016, 04 pages.

Kuypers, Jan H., "High Frequency Oscillators for Mobile Devices", Chapter 15, Real World Implementations Part IV, Jan. 11, 2017, pp. 335-385.

Ho, Gavin K., et al., "High-Order Composite Bulk Acoustic Resonators", IEEE 20th International Conference on Micro Electro Mechanical Systems (MEMS), Jan. 21-25, 2007, pp. 791-794.

Lee, Seungbae, et al., "Mechanically-Coupled Micromechanical Resonator Arrays for Improved Phase Noise", IEEE International Ultrasonics, Ferroelectrics and Frequency Control Joint 50th Anniversary Conference, Aug. 23-27, 2004, pp. 144-150.

Bourgeteau, Beatrice, et al., "Multiphysical Finite Element Modeling of a Quartz Micro-Resonator Thermal Sensitivity", Symposium on Design Test Integration and Packaging of MEMS and MOEMS, Apr. 27-30, 2015, 05 pages.

Bourgeteau, Beatrice, et al., "Quartz Resonator for MEMS Oscillator", European Frequency and Time Forum (EFTF), Jun. 23-26, 2014, pp. 286-289.

Shahmohammadi, Mohsen, et al., "Zero Temperature Coefficient of Frequency in Extensional-Mode Highly Doped Silicon Micro-Resonators", IEEE International Frequency Control Symposium (IFCS), May 22-24, 2012, 04 pages.

Notification of ground of rejection; Application No. 2020-541716; dated Dec. 13, 2022; 8 pages.

* cited by examiner

COUPLED MEMS RESONATOR

FIELD

The aspects of the disclosed embodiments relate to microelectromechanical (MEMS) resonators. In particular, the aspects of the disclosed embodiments relate to length-extensional, torsional or flexural mode resonators.

BACKGROUND

Electromechanical resistance, also known as equivalent series resistance (ESR) is an important performance parameter of a resonator. Compared with traditional quartz crystals, ESR tends to be high in particular in piezoelectrically actuated beam resonators, such as length-extensional (LE) resonators, since the fundamental LE mode can exist in a beam resonator only when the length-to-width aspect ratio is higher than 1, i.e. in a beam that is longer than the width of the beam, and Nth overtone LE mode can exist in a beam resonator whose length-to-width aspect ratio is higher than N. Since the ESR of an LE modes decreases when the width of the beam increases, wider beams would be preferred to get lower ESR. However, the binding of the existence of the LE mode to the aspect ratio sets a lower limit for ESR.

An additional task in MEMS resonator design is to make the frequency of the resonator insensitive to temperature changes, i.e. temperature compensation. Beam resonators fabricated in a single-crystal silicon can, in general, be temperature-compensated with strong enough doping of the silicon crystal, shaping and aligning the beam suitably with respect to the crystal direction of the underlying silicon crystal, and choosing their resonance mode suitably. Temperature compensation by doping is more extensively discussed e.g. in WO 2012/110708 A1.

Beams can oscillate e.g. in a length-extensional (LE) resonance mode, in which the movement occurs mainly in the length-direction of the beam. LE mode has the desired property of having a zero or positive first order temperature coefficient of frequency (TCF), when the resonator beam is directed along the [100] crystalline direction and when doped with a n-type dopant with high enough doping concentration. Positive TCF of silicon allows for use of additional materials that have negative TCFs, which may be needed for piezoelectric actuation purposes, for example, and thus the overall TCF of a composite LE mode resonator can be made zero.

Instead of an LE mode, beam resonators can be excited into flexural or torsional modes. However, similar problems relating to the ESR and temperature compensation are faced with these modes.

Particular challenges are faced when one wishes to have simultaneously low ESR and low temperature dependency. Some piezoelectrically actuated resonators with length-to-width aspect ratio smaller than 1, i.e., relatively wide beams, can support resonance modes which have relatively low ESR levels comparable to quartz crystals at the same frequency. For example, Ho et al, "HIGH-ORDER COMPOSITE BULK ACOUSTIC RESONATORS", MEMS 2007, Kobe, Japan, 21-25 Jan. 2007 and Kuypers J., High Frequency Oscillators for Mobile Devices, in H. Bhugra, G. Piazza (eds.), Piezoelectric MEMS Resonators, Microsystems and Nanosystems, DOI 10.1007/978-3-319-28688-4_15, pp 335-385 show that such resonator designs with low ESR can be implemented, when the beam is aligned with [110] direction of the underlying silicon crystal. These resonance modes, however, have higher temperature dependency than e.g. LE modes and thus they are less usable in piezoelectrically actuated resonators.

Further challenges relating to MEMS resonator design include keeping the quality factor of the resonator as high as possible and the footprint of the resonator as small as possible in order to save manufacturing costs.

Thus, there is a need for improved resonators that have the advantageous properties of beams and still have low ESR, and in particular resonators that can be additionally temperature-compensated.

SUMMARY

It is an aim of the aspects of the disclosed embodiments to overcome the problems discussed above. A particular aim is to provide a beam-like resonator whose electromechanical resistance can be kept low.

An additional aim is to achieve a resonator with low dependency of frequency on temperature.

Further aims include providing low-ESR resonators that have high quality factor (Q-value) and/or small footprint.

The aspects of the disclosed embodiments are based on coupling a plurality of beam-shaped sub-elements to each other using one or more connection elements coupled to non-nodal points thereof, allowing them to resonate in a collective mode. Thus, the whole resonator can be excited as a single resonator, but its shape and orientation limitations are relieved because of the division to sub-elements.

In particular, the aspects of the disclosed embodiments are characterized by what is stated in the independent claims.

According to one aspect, there is provided a microelectromechanical resonator comprising a support structure, a resonator element suspended to the support structure and an actuator for exciting the resonator element to a resonance mode. The resonator element comprises a plurality of adjacent sub-elements each having a length and a width and length-to-width aspect ratio of higher than 1 (i.e. being a beam element). The sub-elements are adapted to resonate in a length-extensional, torsional or flexural resonance mode, in the same or two or more different overtones thereof. Further, each of the sub-elements is coupled to at least one other sub-element by one or more connection elements coupled to non-nodal points of the of the resonance mode of the sub-elements for exciting the resonator element into a collective resonance mode.

The aspects of the disclosed embodiments offer significant benefits. First, by forming the resonator element from coupled sub-elements which are capable of resonating in one of the specified modes, the area, in particular width, of the resonator element can be increased for decreasing the ESR while maintaining the benefits of these modes. It has been found that coupling of the sub-elements in the present way is sufficiently strong so that all of the sub-elements resonate in a collective resonance mode. Consequently, frequency splitting and appearance of multiple resonance modes is avoided.

Importantly, the aspects of the disclosed embodiments are compatible with doping-based (intrinsic) temperature compensation. This means that by aligning the resonator element on a silicon wafer suitably with respect to crystal direction thereof, the temperature dependency of the frequency, i.e. absolute value of the TCF, of the resonator is reduced.

The abovementioned benefits are particularly important in the case of piezoelectric actuation, using which there is the general need of reducing the ESR. Further, piezoelectric actuator material layers arranged of the silicon body of the resonator element has an effect on the TCF, whereby TCF "overcompensation" of the silicon body is beneficial.

Further benefits of the aspects of the disclosed embodiments include the possibility to modify the resonator envelope geometry for making space for different anchoring schemes (in particular central anchoring for minimizing losses) and/or electrical interconnection schemes (in particular for minimizing the area of the resonator component). These schemes as discussed in detail later.

Thus, the aspects of the disclosed embodiments overcome limitations of the prior art in a practical way and allows for new types of resonators to be realized.

The dependent claims are directed to selected embodiments of the present disclosure.

In general, embodiments of the present disclosure allow for both rectangular and non-rectangular resonator shapes and also voided resonator shapes with decreased ESR and optional simultaneous temperature compensation. Non-rectangular and/or voided shapes allow for e.g. high quality factor anchoring and overall component footprint optimization.

In typical embodiments, irrespective of the shape of the whole element, the sub-elements have a rectangular shape and are arranged at a distance from each other in their width and/or length direction, separated by the connection elements.

In some embodiments, at least two of the sub-elements have a length-to-width aspect ratio of more than 2 and are adapted to resonate in an overtone resonance mode having an order number of 2 or higher. In some embodiments, the aspect ratio is more than 3, such as more than 5 and the order number 3 or more, such as 5 or more.

In some embodiments, at least two of the sub-elements are coupled to each other in the width direction thereof, whereby the connection elements comprise at least two essentially rigid connection elements abutting an elongated trench that remains between the sub-elements and extends in the length direction thereof. In some embodiments, there is provided a plurality of trenches defined by the connection elements in the length direction between at least some sub-elements, the number of trenches corresponding to the order number of the overtone mode the sub-elements are adapted to resonate in.

The trenches in the resonator element allow the element to shrink and expand in the transverse direction in addition to the longitudinal shrinkage and expansion also when the element as a whole has low aspect ratio. The sub-elements as such cannot support e.g. an LE mode if the aspect ratio is too low, but in the present way the whole element can support a collective LE mode. This is because the connection elements ensure that the resonator element behaves like a single element, i.e. a like a beam with low effective aspect ratio, which in turn decreases the ESR of the resonator.

In some embodiments, at least two of the sub-elements are coupled to each other in the length direction thereof, whereby the connection elements comprise at least one flexible connection element which spans a gap between the sub-elements. The flexible connection element may have a C-, S-, T-, tilted-I, or meander-shape, for example.

In some embodiments, each sub-element is adapted to resonate in a length-extensional resonance mode. Alternatively, the resonance mode may be torsional or flexural, such as an in-plane flexural resonance mode.

In some embodiments, each sub-element is adapted to resonate in an in-plane length-extensional resonance mode.

In typical embodiments, the connection elements are passive elements formed of a single silicon crystal body, preferably a doped silicon crystal body, together with the sub-elements. This means that the connection elements do not act as actuators, like in some known array resonators, but as passive couplers that ensure that the sub-elements share the same frequency and fundamental mode shape and therefore contribute to the collective mode.

In some embodiments, the actuator is a piezoelectric thin film actuator arranged on top of the resonator element, preferably distributed on top of all sub-elements thereof.

In some embodiments, the resonator element comprises at least 3, for example 3-50, typically 5-24, such sub-elements coupled either side-by-side, end-to-end, or both, with the connection elements.

In some embodiments, at least some of the sub-elements are formed of one or more fundamental elements having a length-to-width aspect ratio of higher than 1 and abutting each other along the length dimension perpendicular to the width dimension, whereby each of the fundamental elements supports a fundamental resonance mode, which together define a collective resonance mode of the sub-element and further for the whole resonator element. The fundamental elements are arranged in a rectangular array configuration, wherein each fundamental element occupies a single array position. In some embodiments, at least one array position of the array configuration is free from fundamental elements. In alternative embodiments each array position is occupied by exactly one fundamental element.

Thus, the resonating fundamental elements together define a collective resonance mode in each sub-element and the coupling of the sub-elements ensures a collective resonance mode of the entire resonator element. Due to the array configuration, the collective resonance is not destroyed by removal of one or more sections each corresponding to one or more adjacent fundamental elements. Thus, desired properties of the resonator are maintained while new design possibilities are made available.

In some embodiments, the resonator element comprises a doped silicon crystal body whose [100] crystal direction is oriented along the length direction of the resonator element or deviates less than 25 degrees, in particular less than 15 degrees, therefrom. This allows for temperature compensation of the element together with low ESR through widening of the resonator element. In some embodiments, the silicon body is doped to an average impurity concentration of at least $2*10^{19}$ cm$^{-3}$, such as at least $10^{20}$ cm$^{-3}$.

In some embodiments, each of the sub-elements has a length-to-width aspect ratio of N or more, where N is the order number of the resonance mode of the sub-element.

In some embodiments, the whole resonator element has an effective length-to-width aspect ratio of less than 2, in particular less than 1.

In some embodiments, all sub-elements of the resonator element have substantially the same width. Further, in some embodiments they have substantially the same length. On the other hand, in some embodiments at least some of the sub-elements have different lengths and are adapted to resonate different but mutually collective overtone resonance modes. Thus, the sub-elements support a different collective overtone of a single fundamental mode. This allows for shaping the envelope geometry of the resonator for various purposes, as will be discussed later.

In some embodiments, the resonator element comprises a plurality of adjacent sub-elements that are adapted to support at least third, such as at least fifth overtone mode of the fundamental mode. This allows for high frequency together with low ESR.

In some embodiments, the resonator element is suspended to the support structure from nodal points of the resonance mode of the sub-elements on opposite lateral sides of the resonator element in the width direction thereof. Alternatively or in addition to that, the resonator element may be suspended to the support structure from nodal points between two sub-elements, preferably symmetrically both in the width and length direction of the resonator element. The two sub-elements need not be, and typically neither are, neighboring elements, but separated by a distance amounting to one or more sub-element (and intervening trench) widths.

Next, embodiments of the present disclosure and advantages thereof are discussed in more detail with reference to the attached drawings.

DETAILED DESCRIPTION OF EMBODIMENTS

Definitions

Figure 1:
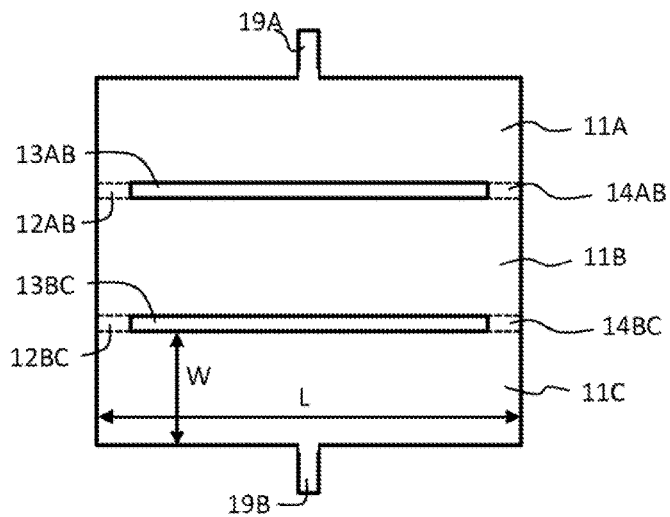
FIGS. 1-5 illustrate top views of fully occupied resonator array configurations formed of fundamental elements.

"Nodal point" herein means a point at the oscillation mode shape, which has average amplitude of oscillation that is less than 20% of the maximum amplitude of the oscillation mode shape.

"Non-nodal point" (or "point displaced from a nodal point") means a point at the oscillation mode shape, which has average amplitude of oscillation that is 20% or more of the maximum amplitude of the oscillation mode shape.

The terms "length" and "longitudinal" are herein used in particular to refer to the in-plane direction parallel to the main expansion direction the LE mode, the torsional axis of a torsional mode or the axis perpendicular to the main flexural displacement of a flexural mode. "Width" and "transverse" refer to the in-plane direction orthogonal to that direction.

Aspect ratio refers to the ratio of in-plane dimensions of an element or sub-element. "Effective aspect ratio" refers to the aspect ratio of the whole resonator element comprising a plurality of sub-elements, in contrast to the aspect ratio(s) of the individual sub-elements (beams) thereof.

"Trench" refers to an empty space inside the resonator element that allows neighboring sub-elements to move with respect to each other and thus the desired mode to arise in a sub-element. An "elongated" trench is a trench having an aspect ratio of 3 or more, such as 5 or more, and even 10 or more, depending on the mode the element is adapt to support.

"Connection element" is any member mechanically connecting two sub-elements located at a distance from each other to each other. A connection element may couple sub-elements in the width direction, whereby it limits a trench or, alternatively, a void or cove within the resonator element at a longitudinal end thereof. In this case, the element is typically an essentially rigid element. Alternatively, it may couple sub-elements in the length direction, whereby it is typically a flexible element, such as a C- or S-shaped element capable of elastically deforming during resonation. Typically, the connection elements are part of the single-crystal structure of the resonator element, generated by patterning the outer shape of resonator element and the trenches therein by known MEMS microfabrication methods.

"Fundamental (resonance) mode" refers to the first order resonance mode (also "first overtone"). A higher overtone mode is formed of several fundamental modes.

"Fundamental element" is a rectangular in-plane portion of a resonator that carries a fundamental resonance mode. Fundamental elements can be in the longitudinal direction seamlessly connected in end-to-end configuration (i.e. "virtual" elements of a beam defined by the mode shape excited therein) or separated by a gap and connected by flexible connection elements. A higher overtone mode of order N can be thought as fundamental modes arising in N longitudinally end-to-end-coupled fundamental elements.

"Collective resonance mode" refers to a compound resonance mode in which all fundamental elements of a particular entity concerned resonate in the same fundamental resonance mode and have essentially the same frequency and the same or 180 degrees shifted phase. In the collective resonance mode of the whole resonator element each of the sub-elements that form the resonator element carries either a first-order length-extensional, torsional or flexural resonance mode or a higher overtone mode thereof. In this case, the resonator element is dividable into typically equally-sized fundamental elements each supporting the same fundamental mode.

In typical embodiments, all fundamental elements of the resonator are arranged in a rectangular array configuration. An "occupied" array position contains a fundamental element. An "unoccupied" array position is empty of resonating material.

"Voided" resonator element shape means a shape in which at least one array position within the resonator element is unoccupied. A void may serve as an anchoring and/or electric contacting region. The desired resonance mode-enabling gaps (trenches) between the sub-elements are not considered as voids in the present context.

Rectangular resonator element is an element whose all peripheral fundamental element array positions are occupied. A non-rectangular element has at least one peripheral array position unoccupied.

"Integer fraction", when the lengths of the sub-elements are concerned, means a fraction N/M, where both N and M are positive integers and N<M. For example, a third overtone sub-element in embodiments of the present disclosure is shorter than a fifth overtone sub-element by integer fraction of 3/5.

Length-extensional (LE) bulk acoustic wave modes of different orders in beam elements are known in the art. In such modes, the element (sub-element) contracts and expands mainly along a single axis, with one or more node points on that axis. In a symmetric element, and in the typical case where both longitudinal ends of the element are free (not anchored to the support structure), the nodal points are symmetrically located along the length of the element. Similarly, torsional and in-plane flexural and out-of-plane flexural mode shapes are known in the art.

"Temperature-compensated" element herein means that the elastic properties of the element that are relevant for the mechanical movement the element is adapted to undergo have, with the present doping level, smaller dependency on temperature than without such doping in at least some temperature range. Typically, temperature compensation is a result of selection of material properties, geometric properties, crystal-orientation-related properties and mode shape. The doping concentration can be $2*10^{19}$ cm$^{-3}$ or more, such as $10^{20}$ cm$^{-3}$ or more. The doping agent may be either an n- or p-type doping agent, such as phosphorus or boron. Temperature compensation herein covers also so-called "overcompensation", i.e. making the TCF of the element as such positive so that when a piezoelectric transducer layer, and/or some other layers are, coupled with the element, the total TCF of the resonator is smaller than without doping.

Description of Selected Embodiments

In general, the resonator elements herein discussed may comprises a plurality of sub-elements with aspect ratios of more than 1, in particular more than N, where N is the overtone number of the collective mode excited therein (i.e. mode order).

The number of sub-elements in the resonator element can be two or more, such as 2-50, in the width direction of the resonator element, and one or more, typically 1-8, such as 2-8 in the length direction.

The number of fundamental elements in the length direction, corresponding to the mode order number excited in a sub-element, can be e.g. 1-20, for example 2-12.

For achieving low ESR, the effective length-to-width aspect ratio of the resonator element is typically less than 2. In some embodiments, the aspect ratio is less than 1.

More detailed embodiments of the present disclosure are below described mainly with reference to the length-extensional mode, for which also experimental data is presented to illustrate feasibility and benefits of the aspects of the disclosed embodiments, but the same principles can be applied to torsional and flexural modes too.

In some embodiments thereof, the present disclosure provides a length-extensional mode resonator, comprising a support structure and a silicon resonator element suspended to the support structure at nodal points thereof, the resonator element having a length and width. The resonator element further comprises at least two sub-elements partially separated from each other by intermediate zones, each of the intermediate zones comprising at least one elongated trench and at least two connection elements abutting the trench and mechanically coupling the sub-elements to each other an non-nodal points thereof. This ensures strong coupling of the sub-elements and therefore behavior of the whole element as a single element with a well-defined resonance mode and resonance frequency. The actuator is adapted to excite the resonator element into a length-extensional resonance mode parallel to the longitudinal direction of the at least one elongated trench.

In some embodiments, the resonator element comprises a body of doped silicon. Further, the [100] crystal direction of the silicon body can be oriented along the length-extensional direction of the resonator element, or it deviates less than 25 degrees, in particular less than 15 degrees, therefrom. This, together with doping of the silicon body of the resonator to an average impurity concentration of at least $2*10^{19}$ cm$^{-3}$, such as at least $10^{20}$ cm$^{-3}$, allows for temperature compensation of the resonator simultaneously to achieving low ESR.

In some embodiments, the resonator element is divided into to three or more sub-elements side by side along the width thereof. This way, the ESR of the resonator can be kept low while maintaining the ability to support LE mode and possibility for efficient temperature compensation.

In some embodiments, there are at least two trenches and three connection elements in at least one intermediate zone, preferably all intermediate zones. This can be used to manufacture e.g. resonator elements dedicated to a specific higher-order LE overtone.

The aspect ratio of sub-elements is typically chosen to be in the range 2:1 . . . 10:1 to keep the number of sub-elements relatively low and the relative area occupied by the trenches low and to obtain maximal benefit of the aspects of the disclosed embodiments. However, the aspects of the disclosed embodiments work with higher aspect ratio sub-elements, too.

FIG. 1 shows a resonator element supporting oscillation in the first and higher order LE modes (overtones). The element comprises three sub-elements 11A, 11B, 110, which are placed side by side along the width direction. Adjacent sub-elements 11A/11B, 11B/11C are coupled to each other by two connection elements 12AB/14AB, 12BC/14BC, located between the sub-elements at or close to the longitudinal ends of the sub-elements. Between the connection elements 12AB/14AB, 12BC, 14BC, there remains a trench 13AB, 13BC, which allows the sub-elements to 11A, 11B, 110 to expand in the width direction during the LE mode oscillation. The linear sequence of connection elements 12AB, 14AB and trench 13AB defines a first intermediate zone and the sequence of connection elements 12BC, 14BC and trench 13BC defines a second intermediate zone.

If each sub-element of FIG. 1 is driven into the first-order mode, i.e. the fundamental mode, the resonator element forms a fully occupied rectangular 3×1 fundamental mode array.

It should be noted that the connection elements 12AB/14AB, 12BC/14BC are not located at the nodal points of LE oscillation modes, but at non-nodal points at or close to the oscillating ends of the sub-elements, which makes the whole element a set of strongly coupled resonators, which are capable of resonating in a collective LE mode.

The element is suspended from the midpoints of the longitudinal outer edges of the element using anchors 19A, 19B. The number of anchors may be more than two. In a typical configuration, the anchors are located at or symmetrically with respect to the transverse mid-axis of the element.

Figure 2:
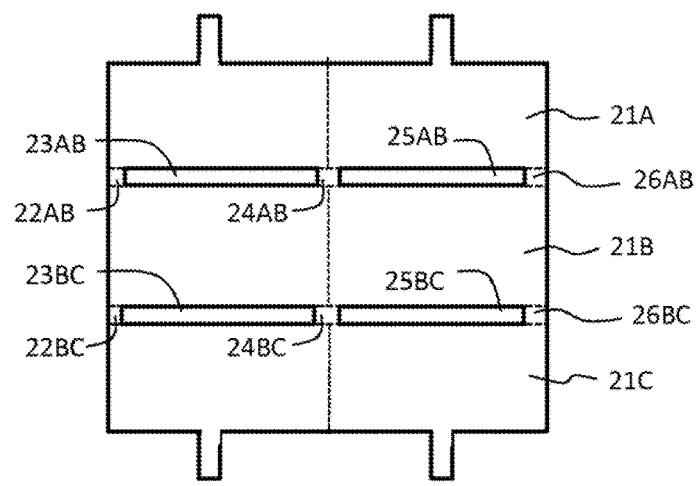

FIG. 2 shows an embodiment which is suitable for second order LE mode oscillation. There are three connection elements 22AB/24AB/26AB, 22BC/24BC/26BC and two trenches 23AB/25AB, 23BC/25BC between each of the sub-elements 21A, 21B, 21C. This configuration allows expansion of the sub-elements in the width direction in the second LE mode, and also other even higher order modes. The resonator element of FIG. 2 forms a rectangular 3×2 fundamental mode array.

Each of the sub-elements has a width W and length L, which may be but need not be the same between different elements. It should also be noted that the connection elements need not be located at the same positions between each sub-element pair and/or the sub-elements and/or trenches need not be perfectly rectangular, but some or all of them can have for example a tapering shape. These variations allow for example for adjusting the TCF of the resonator element, because the aspect ratio of the individual beams affect the TCF of each individual beam and thus the TCF of the full resonator element. In addition, adjustment of the dimensions and shape of the beams as well as the locations, dimensions and number of the connection elements provides additional degrees of freedom, which can be used for setting the frequencies of the parasitic modes to optimal frequencies, where their harmful effects can be minimized.

Figure 3:
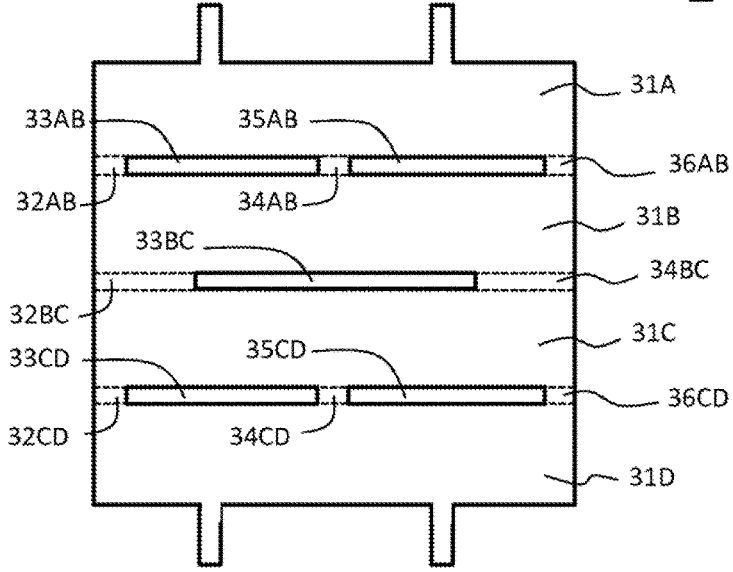

FIG. 3 shows an example where there are four sub-elements 31A-D separated by non-similar intermediate zones. Between each two sidemost sub-elements 31A/31B, 310/31D, there are two trenches 33AB/35AB, 33CD/35CD and three connection elements 32AB/34AB/36AB, 32CD/34CD/36CD, whereas between the middlemost sub-elements 31B/31C, there is a single trench 33BC and two connection elements 32BC/34BC. Other configurations are naturally possible too. The resonator element of FIG. 3 forms a (modified) rectangular 4×2 fundamental mode array.

Figure 4:
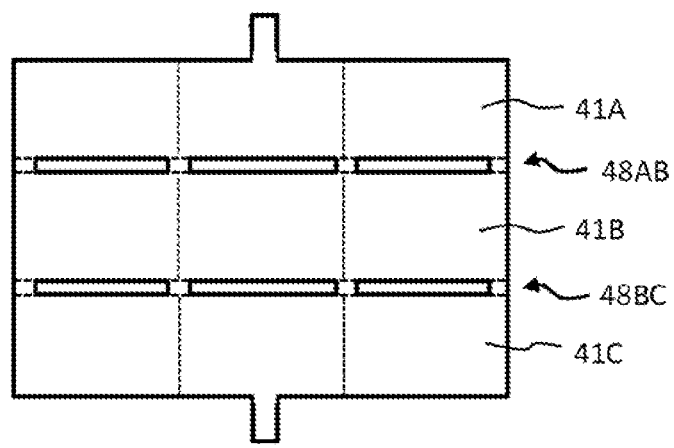

FIG. 4 shows an embodiment with three sub-elements 41A, 41B, 41C interleaved by intermediate zones 48AB, 48BC each having four connection elements and three trenches positioned symmetrically along the length of the sub-elements. The resonator element of FIG. 4 forms a rectangular 3×3 fundamental mode array.

Figure 5:
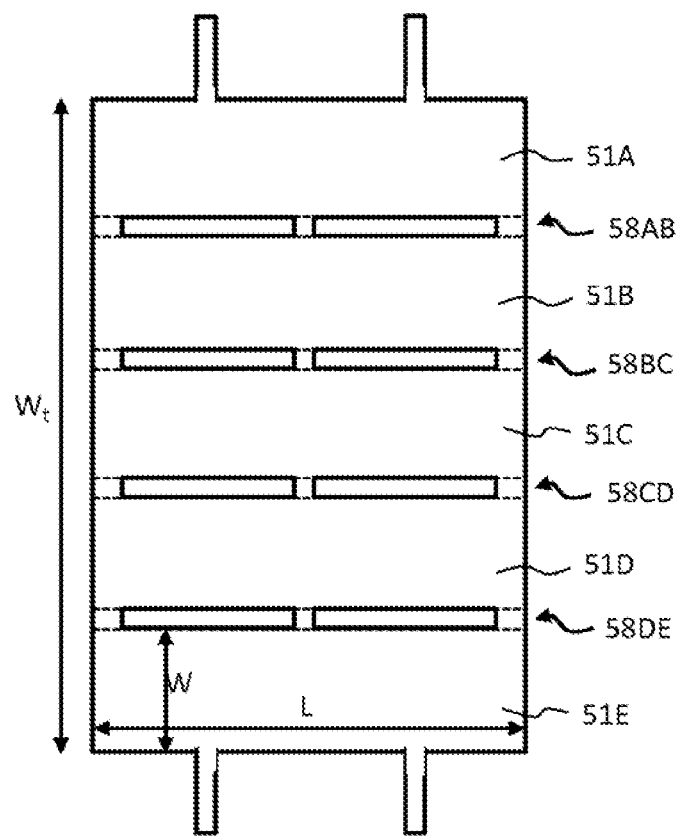

FIG. 5 shows a variation with five sub-elements 51A-E separated by intermediate zones 58AB-DE of the kind discussed with reference to FIG. 2. The total width Wt of the element is in this example larger than its length, which equals to the length L of the sub-elements. The resonator element of FIG. 5 forms a rectangular 5×2 fundamental mode array.

In a typical implementation, at least one trench between each pair of sub-elements is centered at a nodal point of the LE mode.

For the element being able to support the LE mode, the total length of the trench(es) at each intermediate zone between the sub-elements should be a significant portion of the total length L of the element. In some embodiments, this portion is 50% or more, such as 75% or more. In some embodiments, the portion is 90% or more.

In typical configurations, the trench width is 10 □m or less, and preferably as narrow as possible with the fabrication method used so as to minimize the area of the trenches.

In some embodiments, the trenches and connection elements are dimensioned and positioned such that frequency splitting and appearance of plurality of simultaneous resonance modes is avoided. Herein, the principles of A. Jaakkola, et al, "Experimental study of the effects of size variations on piezoelectrically transduced MEMS resonators", Proc. IEEE International Frequency Control Symposium, 2010, pp. 410-414, http://dx.doi.org/10.1109/FREQ.2010.5556299 can be followed.

In some examples, the resonance mode is the fundamental mode and the aspect ratio is 2-4. It may be for example 2.6-3.4. In some examples, the resonance mode is a second order mode or higher and the aspect ratio is 3-10. It may be for example 4.0-8.0 for a second order mode.

Figure 6:
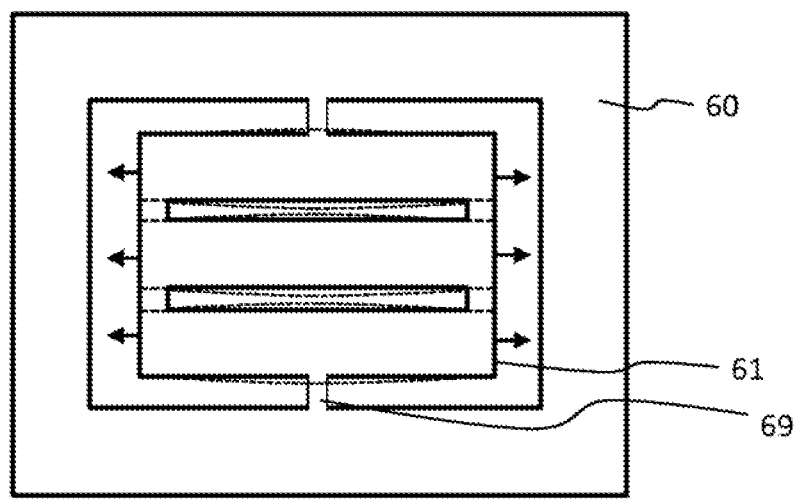
FIG. 6 shows a top view of a resonator element suspended to a support structure.

FIG. 6 illustrates a suspended resonator element. The support structure 60 is separated from the resonator element 61 by a gap at all locations except for the anchors 69 at nodal points on the outer longitudinal sides of the sidemost sub-elements. This allows the resonator element 61 to oscillate freely in the LE mode as discussed above.

In each of the embodiments discussed above, at least one, typically more than one, connection element of each sub-element, is located at a non-nodal point of resonance mode the element is adapted to resonate in. This ensures that the sub-elements are coupled and oscillate in tandem.

Figure 7A:
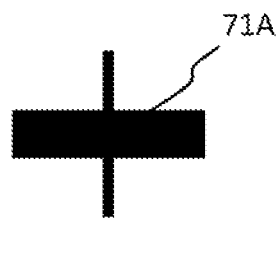
FIGS. 7A, 7B and 7C illustrate a single beam resonator, a beam extended in the width direction in a traditional way, and a resonator element according to the disclosed embodiments, respectively.
Figure 7B:
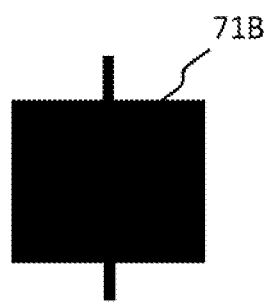
Figure 7C:
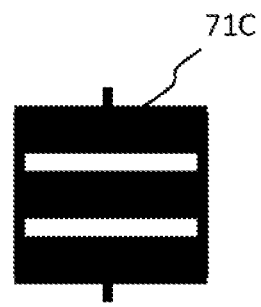

Finally, FIGS. 7A-7C illustrate the difference of the present resonator with respect to conventional resonators. FIG. 7A shows a single high aspect-ratio 71A beam having two free ends. FIG. 7B shows a beam 71B extended in the width direction, making it in fact a rectangular plate. Such resonator has lower ESR and can be used in the [110] direction but does not work in the LE mode when aligned in the [100] crystal direction and therefore cannot be temperature-compensated therein. FIG. 7C shows a resonator element 71C according to an embodiment of the present disclosure. This approach works even if the sides of the element were aligned in the [100] crystal direction and has the same low ESR as the plate of FIG. 7B in the [110] direction.

Figure 8A:
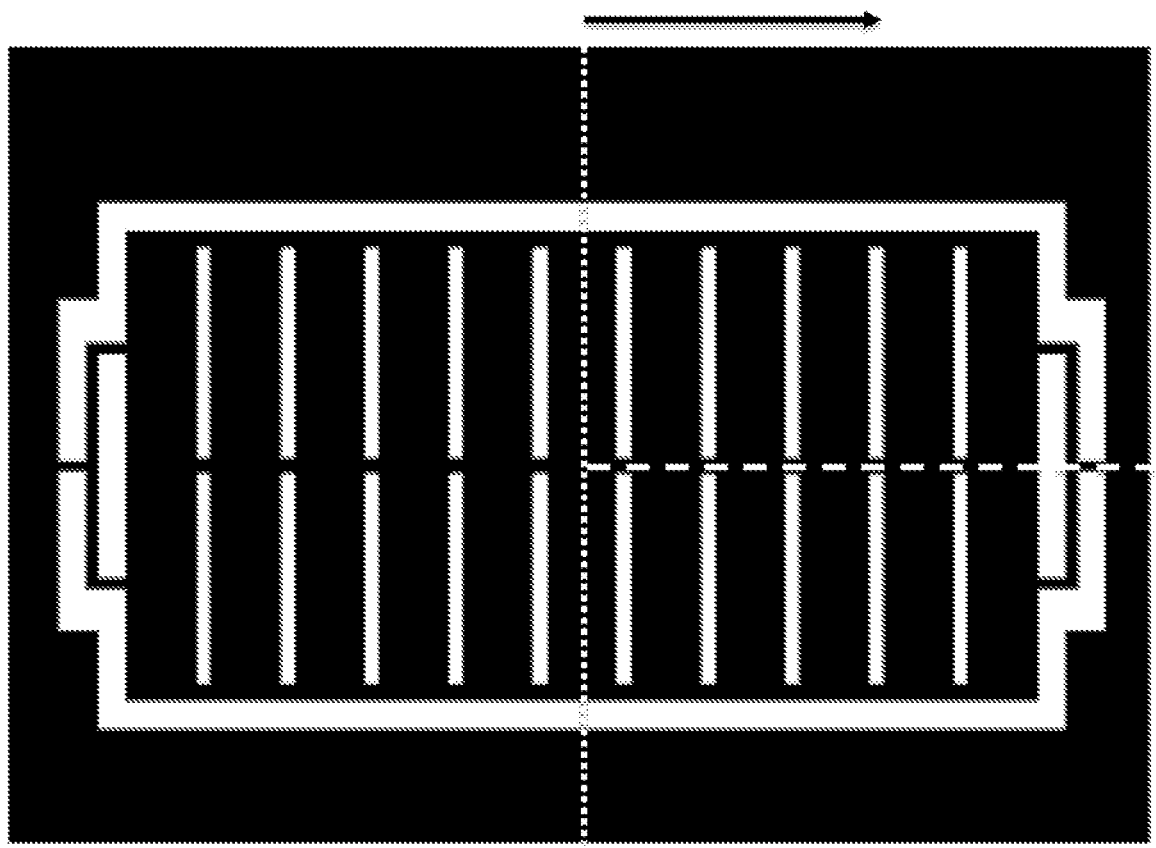
FIG. 8A shows a top view of one resonator configuration designed for the second-order LE mode.

FIG. 8A illustrates a resonator, which is able to support a $2^{nd}$ LE overtone resonance mode. The resonator element thereof is formed of a plurality (here 11) sub-elements each separated from neighboring sub-elements by two elongated trenches arranges one after another and connected to neighboring sub-elements by three connection elements. When the dimensioning of the resonator plate shown is 326 □m×180 □m, the resonance frequency is close to 40 MHz. The resonator element of FIG. 8A forms a rectangular 11×2 fundamental mode array.

Figure 8B:
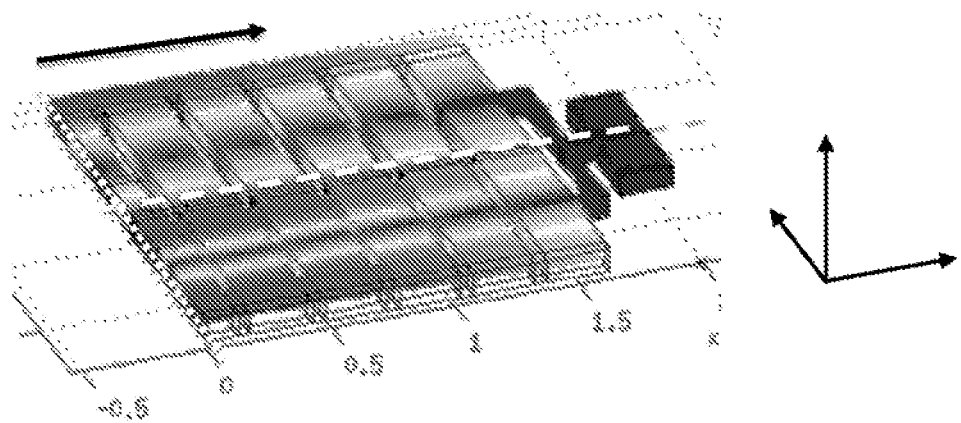
FIG. 8B shows a mode shape graph of a section of a resonator element of FIG. 8A.

FIG. 8B illustrates the LE mode resonance mode shape of the geometry of FIG. 8A, simulated with FEM software. Due to symmetry, only half of the whole resonator is shown. The shades of grey indicate the total displacement at each location. As can be seen, each sub-element resonates in the same collective mode. In the 2nd (and other even orders of resonance), the mode shape is not symmetric, but one end of the sub-elements contracts while the other expands.

Figure 9A:
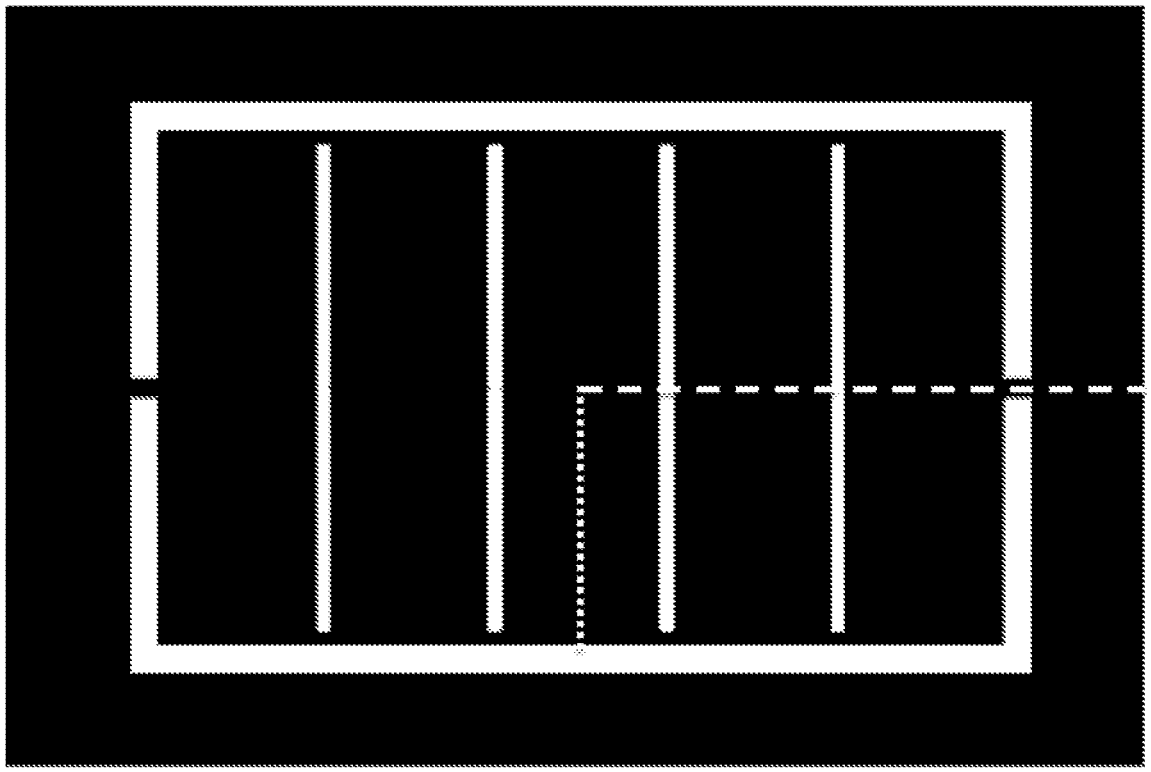
FIG. 9A shows a top view of one resonator configuration designed for the fundamental (first-order) LE mode.

FIG. 9A Illustrates another resonator, which is able to support the fundamental LE resonance mode. When the dimensioning of the resonator plate is 300 □m×180 □m, the resonance frequency is close to 20 MHz. The resonator element of FIG. 8A forms a rectangular 5×1 fundamental mode array.

Figure 9B:
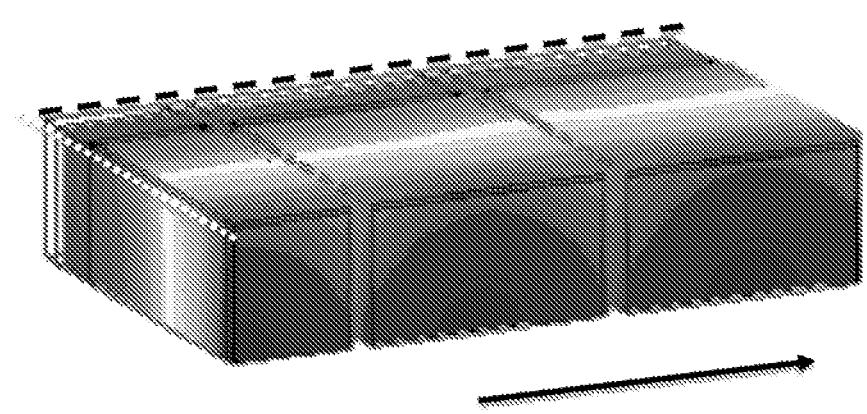
FIG. 9B shows a mode shape graph of a section of a resonator element of FIG. 9A.

FIG. 9B illustrates the LE mode resonance mode shape of the south-east symmetric quarter of the geometry of FIG. 9A, simulated with FEM software.

Figure 10:
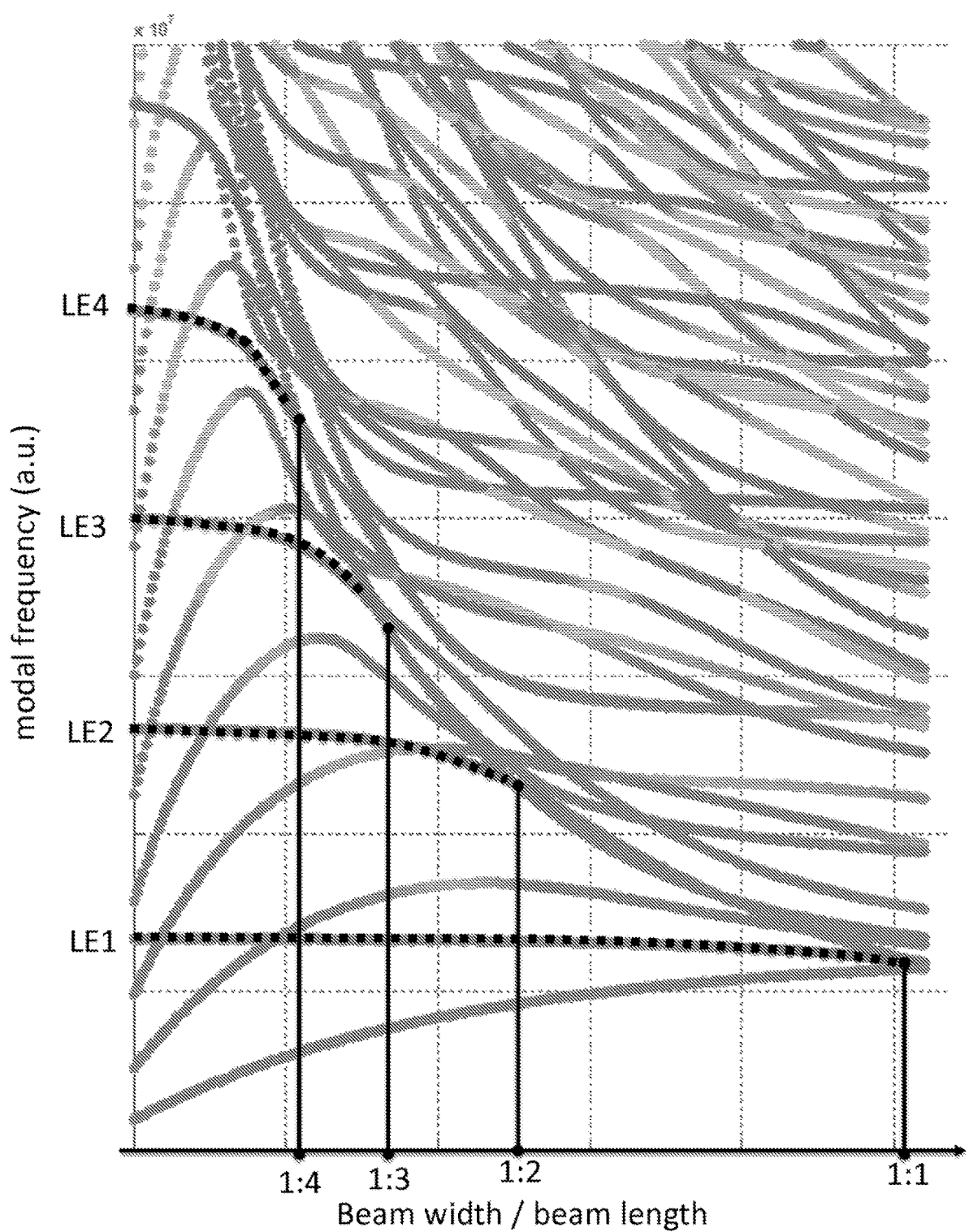
FIG. 10 shows a graph of modal frequencies as a function of beam aspect ratio (width to length) for a plurality of modal orders.

FIG. 10 illustrates a plot of modal frequencies of a beam (here corresponds to a sub-element) whose width-to-length aspect ratio is varied from near zero (very thin beam) to 1. The dashed lines indicate the fundamental LE mode (LE1) and the overtone modes LE2 . . . LE4. Along the LEx modal branches the LEx mode in the direction defined by parameter L exists only at the dashed regions.

Figure 11:
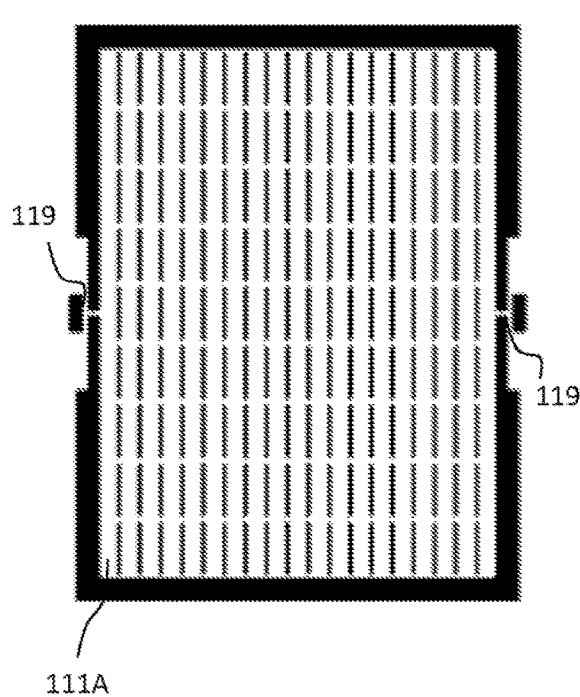
FIG. 11 shows a top view of an exemplary high-order (9th overtone) mode resonator element configuration.

FIG. 11 shows an example of a high (9th) overtone length-extensional resonator element comprising a plurality (19) sub-elements 111A stacked in the width direction and anchored with anchor elements 119 from nodal points at opposite longitudinal sides thereof. For example, to form a resonator oscillating approximately at 120 MHz, the dimensions of the element can be set to 225 μm×170 μm.

Figure 12:
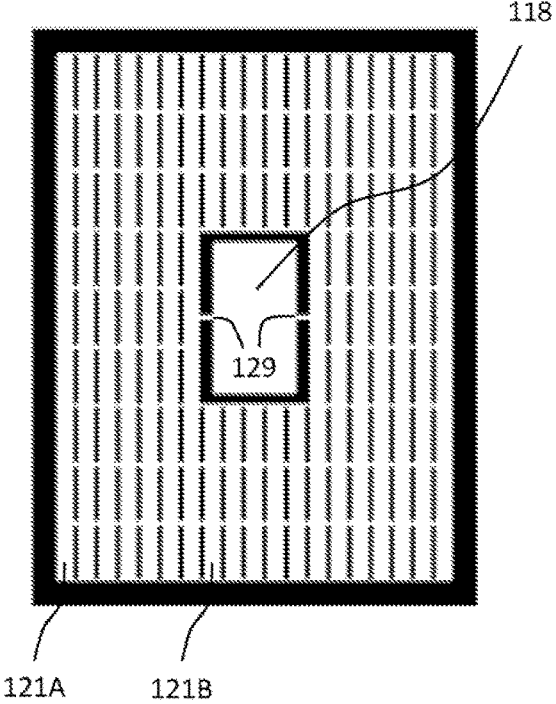
FIG. 12 shows a top view of a voided, centrally anchored variation of the configuration of FIG. 11.

FIG. 12 shows a configuration otherwise similar to that of FIG. 11, but now anchoring has been done using anchor elements 129 at the center of the resonator by providing a void 118 therein, i.e. "removing" some of the central fundamental elements of the sub-elements (in this case 5×3 fundamental elements). Consequently, the resulting structure comprises two types of sub-elements 121A, 121B having different lengths. The length of the shorter sub-element 121B is an integer fraction of the length of the longer element 121A. It has been shown that the collective resonance mode properties of the plate are maintained even though the envelope geometry has been modified.

In general, the present resonator design allows for removing of desired fundamental elements (preferably symmetrically) without losing the desired (collective) mode characteristics of the compound resonator. This has the advantage that LE resonance mode character is maintained even though there is a void in the center. Central anchoring, for its part, is beneficial from the point of view of minimizing packaging stresses which may affect the resonator element. Central anchoring is beneficial also from the point of view of low acoustic losses, whereby the Q-value of the resonator is increased. Losses are reduced due to the highly symmetry of the structure that the aspects of the disclosed embodiments allow.

Figure 13:
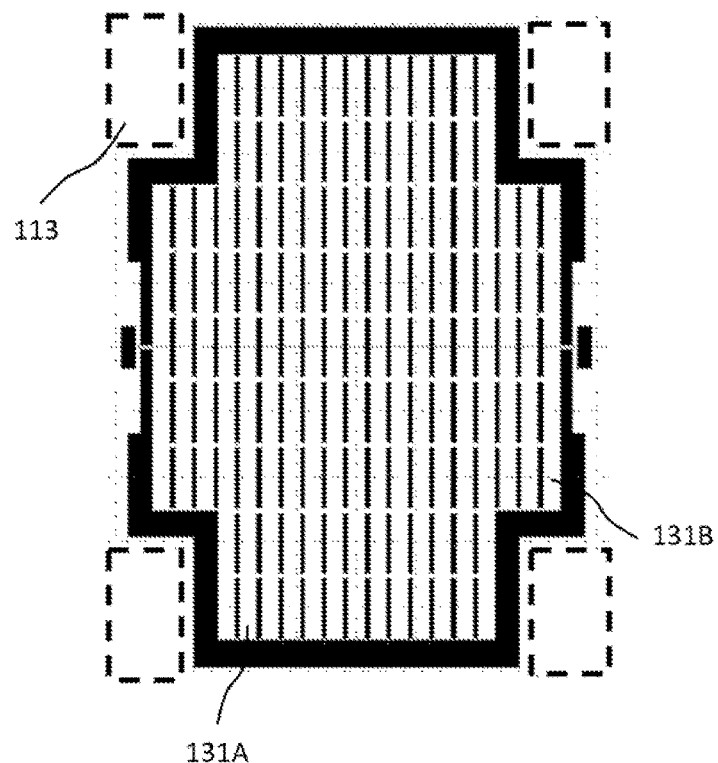
FIG. 13 shows a non-rectangular variation of the configuration of FIG. 11.

FIG. 13 shows an example of a non-rectangular geometry, where fundamental elements are left out at corners of the resonator plate. Also in this case, the resulting structure comprises two types of sub-elements 131A, 131B having different lengths. In this case too, the collective resonance mode properties of the plate are maintained even though the envelope geometry has been modified. The freed zones 113 can be used for electrical interconnects and/or vias of the component, for example.

Thus, voided and/or non-rectangular resonator elements, as exemplified in FIGS. 12 and 13 are beneficial because the footprint of the resonator component can be minimized, taking into account that in common dicing processes, a wafer containing a plurality of components is cut into rectangular sections each containing a single component. The areas freed from the resonator area can be used for anchoring or internal or external connection purposes, only to mention some potential needs. The embodiments of FIG. 12 and FIG. 13 can also be combined to provide a voided and non-rectangular resonator element.

The resonator elements of FIG. 11-13 form a rectangular 19×11 fundamental mode arrays. The array positions of FIG. 11 are fully occupied but there are unoccupied array positions in FIGS. 12 and 13.

Figure 14A:
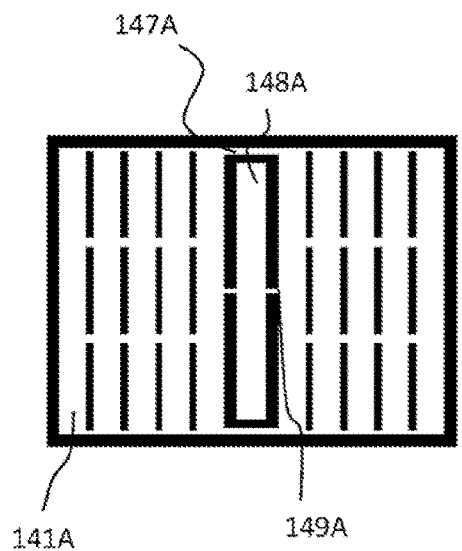
FIGS. 14A-D show further examples of centrally anchored voided, split and non-rectangular resonator elements.

FIG. 14A shows an embodiment 141A which is similar to that of FIG. 12, but now adapted for smaller frequency (overtone 3). The void 148A herein is produced by "removing" all fundamental elements of one sub-element, and using longer connection elements 147A at the longitudinal ends of the void 148A. Central anchoring with anchor elements 149A is achieved.

Figure 14B:
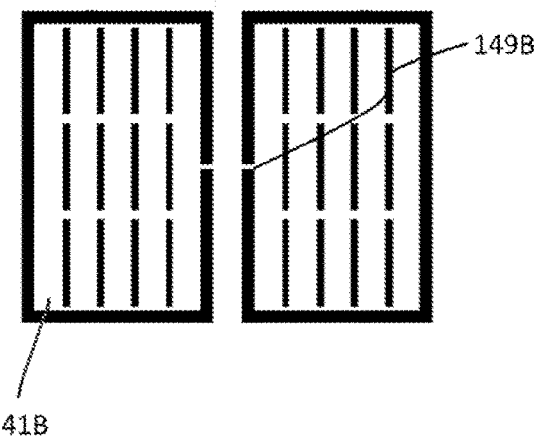

FIG. 14B shows further variation 141B, in which the longer coupling elements 147A of FIG. 14A are omitted, making the resonator in fact a double-element resonator, each single element being of the presently discussed kind. This is a simple geometry to process, since anchoring to surrounding substrate does not require to for structural contact to the backside or top wafer as the design of FIG. 14A. In order for a collective mode to exist between the two elements of the resonator, the anchoring 149B need to be implemented such that they are not too weakly coupled with each other (which would be likely to produce two different peaks due to manufacturing imperfections).

Figure 14C:
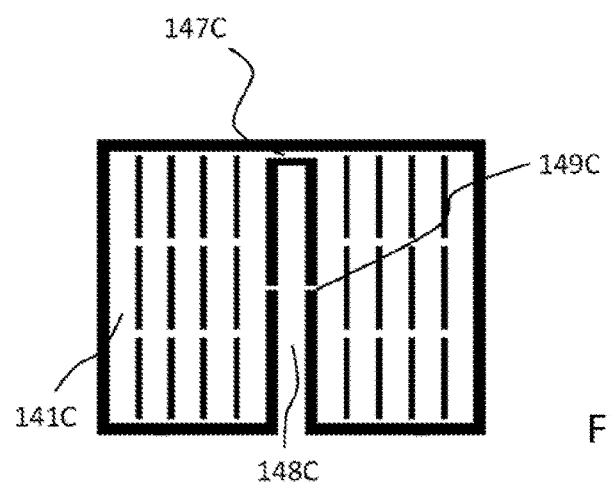
Figure 14D:
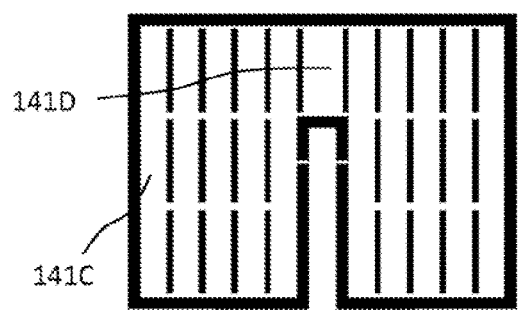

FIGS. 14C and 14D show further embodiments which combine the benefits of FIGS. 14A and 14B and provide both central anchoring, easy electric access to actuator and overcome the potential problem of weak coupling. The configuration of FIG. 14C couples the left and right side so that one compound mode exists, using one longer connection element 147C and supports structure 148C extending to the central anchoring zone and anchor elements 149C on the opposite side of the element. The embodiment of FIG. 14D is similar to that of FIG. 14C, but here the sufficient coupling is achieved, and also ensured, with one full fundamental element-containing sub-element 141D, which has an integer fraction length of the other sub-elements 141C.

The resonator elements of FIGS. 14A-D form a rectangular 11×3 fundamental mode arrays, with 3 unoccupied array positions in FIGS. 14A-C and 2 unoccupied array positions in FIG. 14D. (Depending on coupling strength, the embodiment of FIG. 14B can also be seen as two 5×1 arrays).

Generally speaking, in some embodiments, like those of FIGS. 12, 13 and 14D, there are at least two different types of sub-elements, the first type having a first length and the second type having a second length which amounts to an integer fraction of the length of the first type for exciting the sub-elements of different types into different overtone modes of a collective fundamental resonance mode.

In some examples, like those of FIGS. 12 and 14D, at least one sub-element of the second (shorter) type is positioned between two sub-elements of the first (longer) type. This leaves space for central anchoring, for example, in which case the resonator element is suspended to the support structure from the two sub-elements of the first type on opposite sides of the sub-element of the second type.

In some examples, like that of FIG. 12, the resonator element comprises a void defined by two or more of the sub-elements of the second type and the two sub-elements of the first type, the support structure being at least partly arranged in the void, and the resonator element is suspended to the support structure within the void. Thus, the resonator element is centrally anchored, surrounding the anchor position in the lateral plane.

In some embodiments, like that shown in FIG. 14D, the resonator element comprises a cove (i.e. lateral recess) defined by one or more of the sub-elements of the second type and the two sub-elements of the first type, the support structure being at least partly arranged to extend within the cove, and the resonator element is suspended to the support structure within the cove.

By means of both void and cove configurations central anchoring can be achieved, which can be used to minimize losses of the resonator. The void configuration has the benefit that fully symmetric resonator can be achieved, whereas the cove configuration allows for more simple electric access to the surface of the resonator which typically contains the piezoelectric actuation layers. By means of the cove configuration, through-silicon vias in the wafer can be entirely avoided. In the void configuration, a through-silicon via can be arranged in the wafer to the region of the void.

Figure 15A:
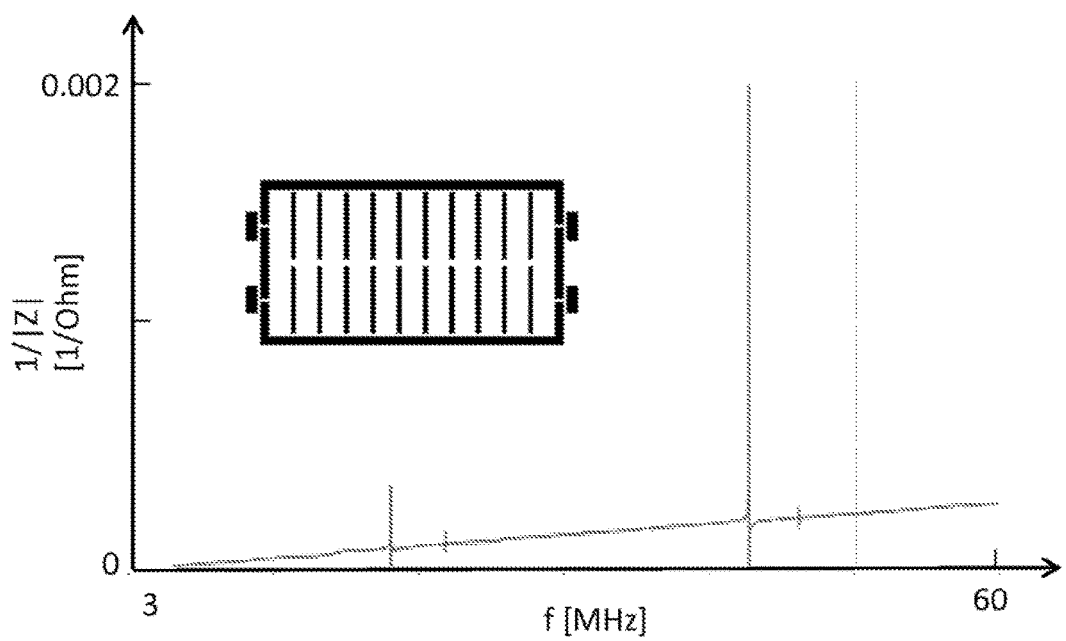
FIG. 15A shows a measured wide-frequency range admittance graph of a piezoelectrically coupled 2nd overtone mode resonator of FIG. 8A.

FIG. 15A shows a measured wide-frequency range admittance graph of of piezoelectrically coupled 2nd overtone mode resonator corresponding to that of FIG. 8A, when fabricated on a wafer with Si/AlN/Mo materials stack with thicknesses of 28/1/0.3 µm. One can deduce that the main mode at 42 MHz is excited cleanly. That is, there are only few parasitic resonance modes, at 18 MHz for example, and they are coupled much more weakly than the main mode.

Figure 15B:
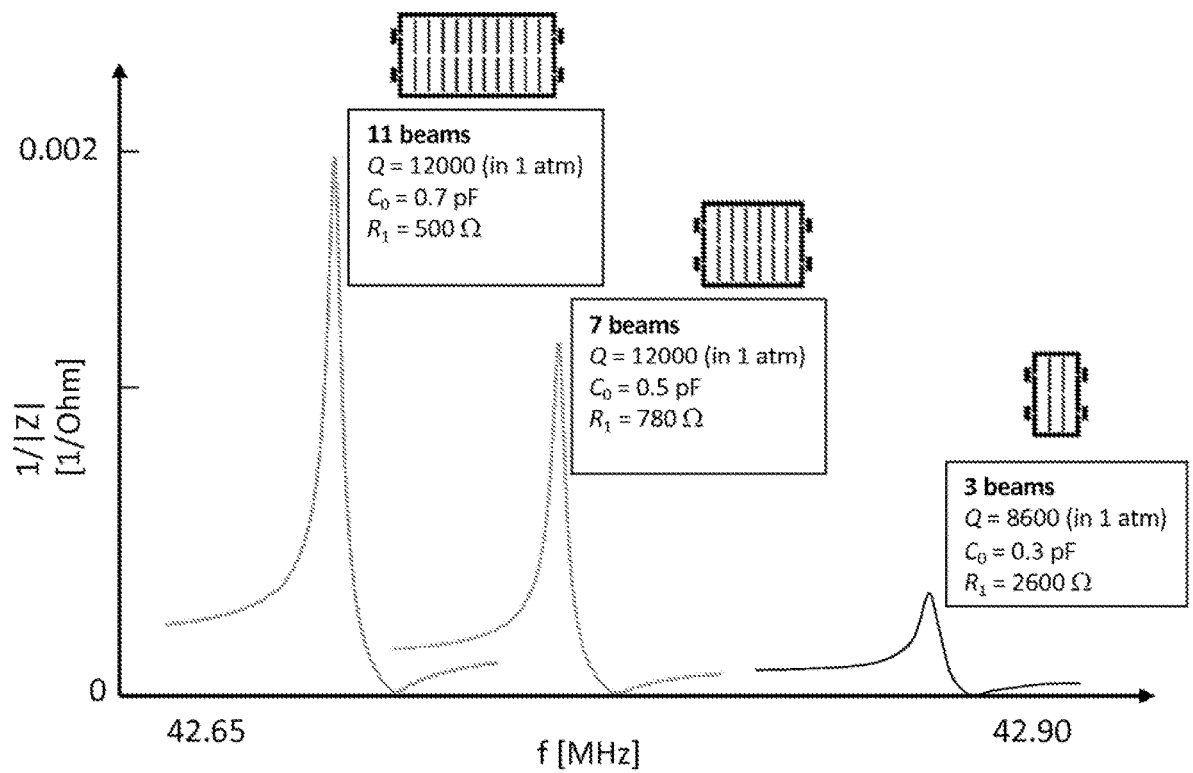
FIG. 15B shows a detail of the admittance graph of the main resonances of FIG. 15A.

FIG. 15B shows a detail of the admittance plot of the main resonances of the design of FIG. 15A (labeled as "11 beams", and corresponding plots of the main resonances of otherwise similar resonators as that of FIG. 15A but with smaller number of coupled beam elements (labeled as "7 beams" and "3 beams", respectively. Resonator quality factor Q, shunt capacitance Co and equivalent series resistance $R_1$ (=ESR), obtained through fits to the measurement results, are shown for all three cases. The figure illustrates how the ESR is decreased when the resonator width, proportional to the number of coupled beam elements, is increased.

Figure 15C:
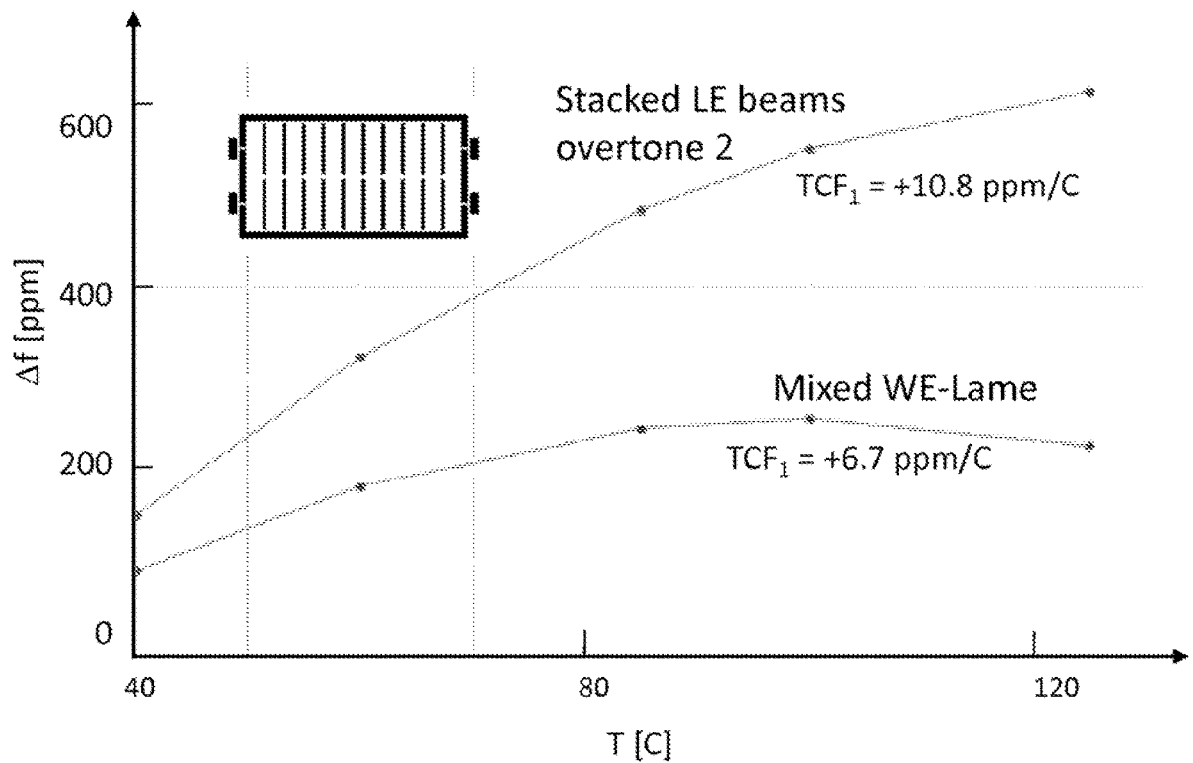
FIG. 15C shows a measured frequency-vs-temperature curve of the resonator of FIG. 8A.

FIG. 15C shows the measured frequency-vs-temperature curve of the resonator of FIG. 15A (labeled as "stacked LE beams overtone 2") and the same characteristic of a mixed WE-Lame mode resonator similar to that discussed in WO 2018/002439 A1, when both are fabricated on same wafer with n-type doping of $7*10^{19}$ cm$^{-3}$. It can be seen that the linear temperature coefficient TCF1 of the first resonator is approximately 4 units higher than the same parameter of the latter resonator. Thus, there is higher overcompensation, which has the benefit that one can use for example to use thicker AlN layer for piezoelectric actuation purposes to achieve a temperature compensated design.

Figure 16A:
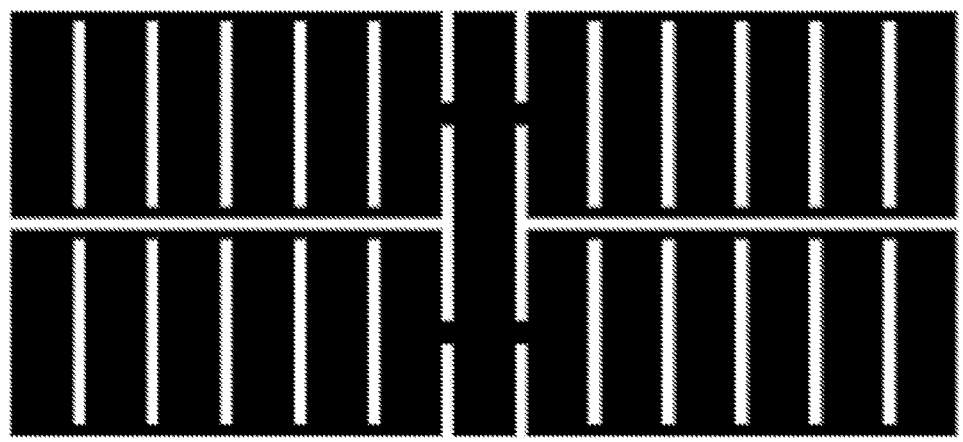
FIG. 16A shows a top view of a multiple-branch width-coupled resonator plate.

FIG. 16A shows resonator element configuration having four branches of side-by-side coupled short sub-elements anchored to a central support element at nodal points. Each branch element is a 6×1 fundamental mode array resonator element having non-nodal internal couplings between sub-elements thereof.

In one variation (not shown in detail) of FIG. 16A, to ensure collective resonance between the branches, the central element is a resonating sub-element and coupling of the branches to the central sub-element may also be at non-nodal points, whereby a 13×2 fundamental mode array is formed.

Figure 16B:
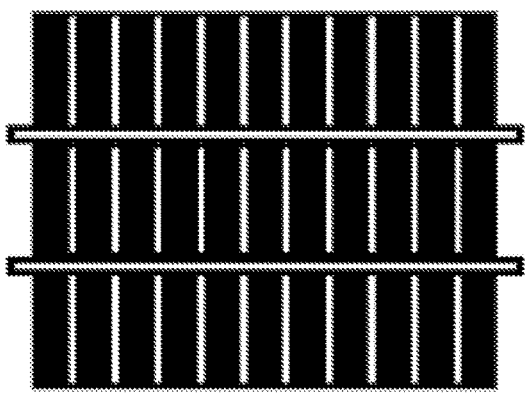
FIG. 16B shows a top view of a longitudinally coupled resonator plate.

FIG. 16B shows a top view of a longitudinally coupled resonator plate comprising three rows of 11 columns fundamental-mode sub-elements. Each row is coupled to another row using flexible longitudinal connection elements at both ends thereof. Each row is internally coupled using rigid connection elements, as discussed above. An 11×3 fundamental element array is formed.

Figures 17A, 17B, 17C, 17D, 17E:
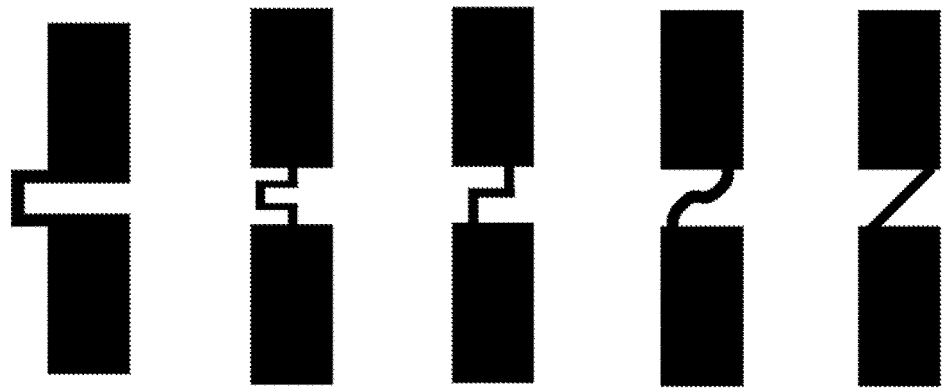
FIGS. 17A-E illustrate different possible flexible connection element geometries between longitudinally coupled sub-elements.

FIGS. 17A-E illustrate different possible flexible connection element geometries between longitudinally coupled sub-elements. A side-connectable shape "C"-shape used also in the configuration of FIG. 16B is shown in FIG. 17A. End-connectable shapes are shown in FIGS. 17B-17E. These show an end-connectable C-shape of FIG. 17B, S-shapes of FIGS. 17C and 17D, and a tilted I-shape of 17E. One appreciates, that other flexible shapes and variations of the illustrated ones are possible too.

Figure 18A:
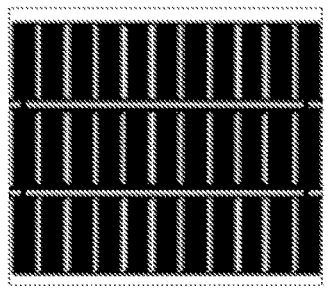
FIGS. 18A-C illustrate examples of different longitudinal coupling positions.
Figure 18B:
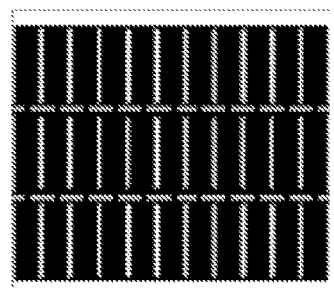
Figure 18C:
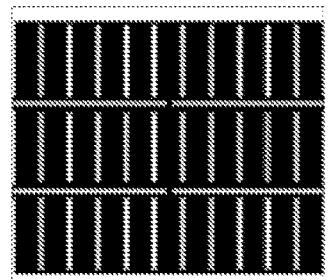
Figure 19A:
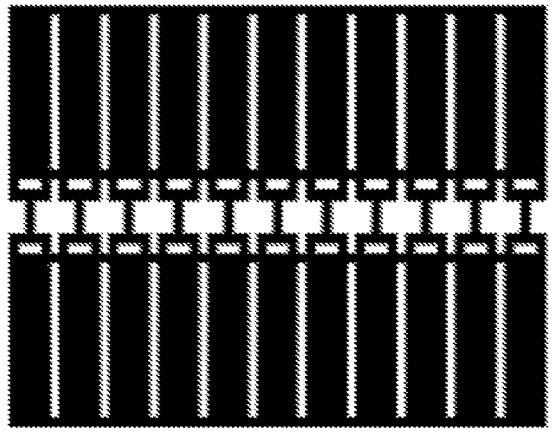
FIGS. 19A-D illustrate further examples of flexible connection elements for longitudinal coupling.
Figure 19B:
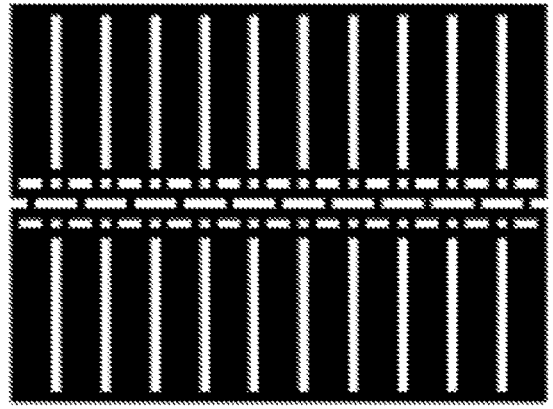
Figure 19C:
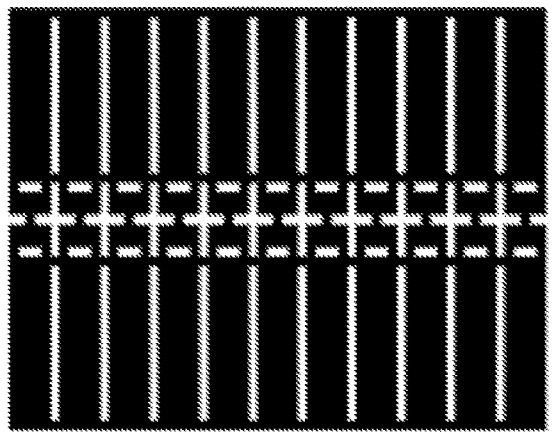
Figure 19D:
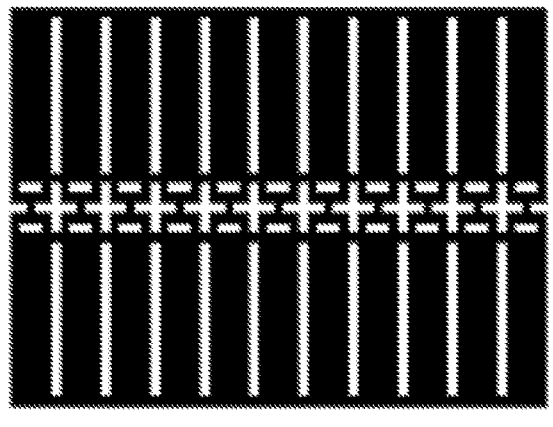

FIGS. 18A-C schematically illustrate examples of different longitudinal coupling options on the resonator plate level. As can be seen longitudinal coupling can be arranged directly between the longitudinal elements at any, preferably symmetrical configuration using e.g. the elements of FIG. 17B-E (connection elements not shown in detail in FIGS. 18A-C).

Instead of or in addition to end-to-end connection of sub-elements in the same column, as shown in the above-discussed examples, one can connect sub-elements of different columns using longer elements extending over column boundaries in the width direction (not shown).

FIGS. 19A-D show further examples of flexible connection elements each having at least one T-branch.

The invention claimed is:

1. A microelectromechanical resonator assembly, comprising:
    a first rectangular resonator array; and
    a second rectangular resonator array, wherein
        the first rectangular resonator array and the second rectangular resonator array each comprise at least two rectangular resonating sub-elements, and the at least two rectangular resonating sub-elements are coupled to each other by one or more connection elements, and the first rectangular resonator array and the second rectangular resonator array are coupled to each other by one or more connection elements.

2. The resonator assembly according to claim 1, wherein the rectangular resonator arrays are coupled to each other in the width direction thereof or in the length direction thereof.

3. The resonator assembly according to claim 1, wherein the at least two rectangular resonating sub-elements are coupled to each other in the width direction thereof or in the length direction thereof.

4. The resonator assembly according to claim 1, wherein at least two of the rectangular resonating sub-elements are coupled to each other in the width direction thereof or in the length direction thereof.

5. The resonator assembly according to claim 1, wherein the rectangular resonating sub-elements are coupled to each other longitudinally or transversally.

6. The resonator assembly according to claim 1, wherein the connection element(s) comprise at least two essentially rigid connection elements abutting an elongated trench that remains between the rectangular resonator arrays or the rectangular resonating sub-elements and extends in the length direction thereof.

7. The resonator assembly according to claim 1, wherein the rectangular resonator arrays are coupled to each other by a flexible connection element which spans a gap between the rectangular resonator arrays.

8. The resonator assembly according to claim 1, wherein the connection elements are flexible connection elements which span a gap between the rectangular resonator arrays or the rectangular resonating sub-elements.

9. The resonator assembly according to claim 1, wherein the connection elements are straight, curved or a right-angled.

10. The resonator assembly according to claim 1, wherein the connection elements are T-branched or meander-shaped.

11. The resonator assembly according to claim 1, wherein the connection elements are side-connectable or end-connectable connection elements.

12. The resonator assembly according to claim 1, comprising a thin-film piezoelectric actuator.

13. The resonator assembly according to claim 1, wherein the rectangular resonating sub-elements resonate in an in-plane length-extensional resonance mode.

14. The resonator assembly according to claim 1, wherein each rectangular resonating sub-element is coupled to at least one other rectangular resonating sub-element by one or more connection elements coupled to non-nodal points of a collective resonance mode.

15. The resonator assembly according to claim 1, wherein the aspect ratio of sub-elements is in the range 2:1 ... 10:1.

16. The resonator assembly according to claim 1, wherein the resonator assembly is centrally anchored.

17. The resonator assembly according to claim 1, wherein the resonator assembly comprises a silicon crystal body whose [100] crystal direction is oriented along the length direction of the resonating sub-element or deviates less than 15 degrees therefrom.

18. The resonator assembly according to claim 1, wherein the rectangular resonator arrays are arranged at a distance from each other in their width and/or length direction, separated by the connection elements.

19. The resonator assembly according to claim 1, wherein the rectangular resonating sub-elements are arranged at a distance from each other in their width and/or length direction, separated by the connection elements.

20. The resonator assembly according to claim 1, comprising the first rectangular resonator array and the second rectangular resonator array oriented in parallel in a common plane.

* * * * *